United States Patent
Shimoto et al.

[19]

[11] Patent Number: 5,889,233
[45] Date of Patent: Mar. 30, 1999

[54] MULTILAYER WIRING STRUCTURE

[75] Inventors: Tadanori Shimoto; Koji Matsui, both of Tokyo, Japan

[73] Assignee: NEC Corporation, Tokyo, Japan

[21] Appl. No.: 696,645

[22] Filed: Aug. 14, 1996

[30] Foreign Application Priority Data

Aug. 14, 1995 [JP] Japan .................................. 7-206374

[51] Int. Cl.$^6$ ..................................................... H05K 1/00
[52] U.S. Cl. ........................... 174/250; 361/795; 428/209
[58] Field of Search ..................................... 428/209, 901; 361/780, 792, 793, 794, 795; 174/250, 255, 258, 260, 261

[56] References Cited

U.S. PATENT DOCUMENTS

| | | | |
|---|---|---|---|
| 4,226,737 | 10/1980 | Kluger et al. | 252/182.13 |
| 4,977,105 | 12/1990 | Okamoto et al. | 437/190 |
| 5,094,714 | 3/1992 | Nishimura et al. | 156/616.4 |
| 5,227,012 | 7/1993 | Brandli et al. | 156/643 |
| 5,250,757 | 10/1993 | Kawakami et al. | 174/250 |
| 5,349,155 | 9/1994 | Yamagishi et al. | 219/121.71 |
| 5,350,886 | 9/1994 | Miyazaki et al. | 174/250 |
| 5,382,757 | 1/1995 | Ishida | 174/262 |
| 5,388,754 | 2/1995 | Grosclaude et al. | 228/118 |
| 5,452,182 | 9/1995 | Eichelberger et al. | 361/749 |
| 5,590,461 | 1/1997 | Ishida | 29/830 |

FOREIGN PATENT DOCUMENTS

| | | |
|---|---|---|
| 2-275664 | 11/1988 | Japan . |
| 4-211194 | 2/1991 | Japan . |
| 719973 | 3/1995 | Japan . |

*Primary Examiner*—Kristine Kincaid
*Assistant Examiner*—Dhiro R. Patel
*Attorney, Agent, or Firm*—Sughrue, Mion, Zinn, Macpeak & Seas, PLLC

[57] ABSTRACT

A multilayer wiring structure having a flame-retardant property corresponding to the V-0 class in the UL 94 standard is provided without degrading the inherent properties of a benzocyclobutene resin. The multilayer wiring structure contains a lower-level wiring layer formed on a base material, a lower-level interlayer insulating layer formed to cover the lower-level wiring layer, and an upper-level wiring layer formed on the interlayer insulating layer, an upper-level interlayer insulating layer formed to cover the upper-level wiring layer, and a protection layer formed to cover the upper-level interlayer insulating layer. Each of the lower- and upper-level interlayer insulating layers is made of a benzocyclobutene resin. The protection layer has a flame-retardant or non-flammable property corresponding to the V-0 class in the UL 94 standard. The protection layer may be made of a flame-retardant material such as a fluororesin, a polyimide resin or an epoxy resin. The protection layer may be made of a non-flammable material such as silicon dioxide or silicon nitride.

6 Claims, 3 Drawing Sheets

MULTILAYER WIRING STRUCTURE

BACKGROUND OF THE INVENTION

1. Field of the Invention

The present invention relates to a multilayer wiring structure and more particularly, to a multilayer wiring structure including a benzocyclobutene resin layer serving as an interlayer insulating layer for adjoining wiring or interconnection layers, which is applicable to a multilayer wiring board and a semiconductor device.

2. Description of the Prior Art

As the recent trend of the increasing operation speed and the increasing integration scale of semiconductor devices, an interlayer insulating material of a multilayer wiring-board on which the semiconductor device chip or chips are mounted has been required to have not only a heat resistance property but also low dielectric-constant, low water-absorption coefficient, high adhesion properties. As an example of the insulating materials having these properties, a benzocyclobutene resin has been known.

Especially, the benzocyclobutene resin has a good adhesion property to copper (Cu) and has no tendency of the electromigration phenomenon to copper. Therefore, a multilayer wiring board having the benzocyclobutene resin as the insulating material was developed, in which wiring layers contain copper as a primary constituent.

FIG. 1 shows a conventional multilayer wiring board, which was disclosed in the Japanese Examined Patent Publication No. 7-19973 published in March 1995.

In FIG. 1, a first-level wiring layer 22 is formed on an insulating base material 21. The wiring layer 22 is formed by a patterned conductor layer containing copper as a primary constituent. The insulating base material 21 is usually made of silicon, saffhire, or ceramic containing alumina or the like as its primary constituent.

An interlayer insulating layer 23 made of a benzocyclobutene resin is formed to cover the first-level wiring layer 22. The layer 23 is contacted with the exposed area of the base material 21. The layer 23 has a penetrating via hole 24 through which the first-level wiring layer 22 is electrically interconnected with a second-level wiring layer 25.

The second-level wiring layer 25 is formed on the interlayer insulating layer 23 to be contacted with the underlying first-level wiring layer 22 through the via hole 24. The second-level wiring layer 25 also is formed by a patterned conductor layer containing copper as a primary constituent.

Although not shown in FIG. 1, to form a third- and higher level wiring layers, some sets of the interlayer insulating layer 23 and the wiring layer 25 are formed to be stacked on the second-level wiring layer 25 as necessary, thereby constituting a multilayer wiring structure on the base material 21.

As described above, the benzocyclobutene resin has not only a good heat-resistance property but also a low dielectric-constant and a low adhesion property and therefore, it is a good insulating material for an interlayer insulating material of the sort. However, this resin has a problem that it does not have a satisfactory flame-retardant property which corresponds to the V-0 class in the Underwriters' Laboratories (UL) 94 standard.

Specifically, for an electronic equipment which generates a large amount of heat, consumes a large amount of electric power, and requires severe reliability (for example, a main-frame computer), the conventional multilayer wiring board shown in FIG. 1, which contains the interlayer insulating materials made of the benzocyclobutene resin, cannot be applied.

With conventional multilayer wiring boards applicable to the electronic components of this sort, to realize a satisfactory flame-retardant property corresponding to the V-0 class in the UL 94 standard, an epoxy or polyimide resin containing any flame-retardant agent has been used as the interlayer insulating material for electrically insulating adjoining wiring layers.

Similarly, if a suitable flame-retardant agent is added to the benzocyclobutene resin, it may have a satisfactory flame-retardant property corresponding to the V-0 class in the UL 94 standard. However, another problem that the inherent properties of the benzocyclobutene resin degrade due to the addition of the flame-retardant agent will take place.

SUMMARY OF THE INVENTION

Accordingly, an object of the present invention is to provide a multilayer wiring structure having a flame-retardant property corresponding to the V-0 class in the UL 94 standard without degrading the inherent properties of a benzocyclobutene resin.

The above object together with others not specifically mentioned will become clear to those skilled in the art from the following description.

A multilayer wiring structure according to the present invention comprises a lower-level wiring layer formed on or over a base material, a lower-level interlayer insulating layer formed to cover the lower-level wiring layer, and an upper-level wiring layer formed on the interlayer insulating layer, an upper-level interlayer insulating layer formed to cover the upper-level wiring layer, and a protection layer formed to cover the upper-level interlayer insulating layer.

Each of the lower- and upper-level interlayer insulating layers is made of a benzocyclobutene resin. The protection layer has a flame-retardant or non-flammable property.

With the multilayer wiring structure according to the present invention, since the protection layer having a flame-retardant or non-flammable property is formed to cover the upper-level interlayer insulating layer made of a benzocyclobutene resin, the flame-resistance performance is realized by the protection layer. As a result, no additional flame-retardant agent needs to be added to the underlying lower- and upper-level insulating layers made of the benzocyclobutene resin.

Accordingly, the multilayer wiring structure can obtain a flame-retardant property corresponding to the V-0 class in the UL 94 standard without degrading the inherent properties of the benzocyclobutene resin.

It is preferred that the protection layer is made of a resin selected from the group consisting of a fluororesin, a polyinide resin, and an epoxy resin. In this case, it is preferred that the resin of the protection layer has a heat resistance property, and the resin has a glass transition temperature of 160° C. or higher.

The protection layer may be made of a solder-resist material used in soldering electronic components onto a printed wiring board, because this material decreases the fabrication cost.

As the non-flammable material, it is preferred that silicon dioxide ($SiO_2$) or silicon nitride ($Si_3N_4$) is used.

In a preferred embodiment of the invention, the multilayer wiring structure is applied to a multilayer wiring board, in which a printed wiring board is used as the base material.

In another preferred embodiment of the invention, the multilayer wiring structure is applied to a semiconductor device, in which a semiconductor such as silicon (Si) or an insulator such as safFhire or ceramic is used as the base material.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Preferred embodiments of the present invention will be described in detail below while referring to FIGS. 2 and 3.

First Embodiment

Figure 1:
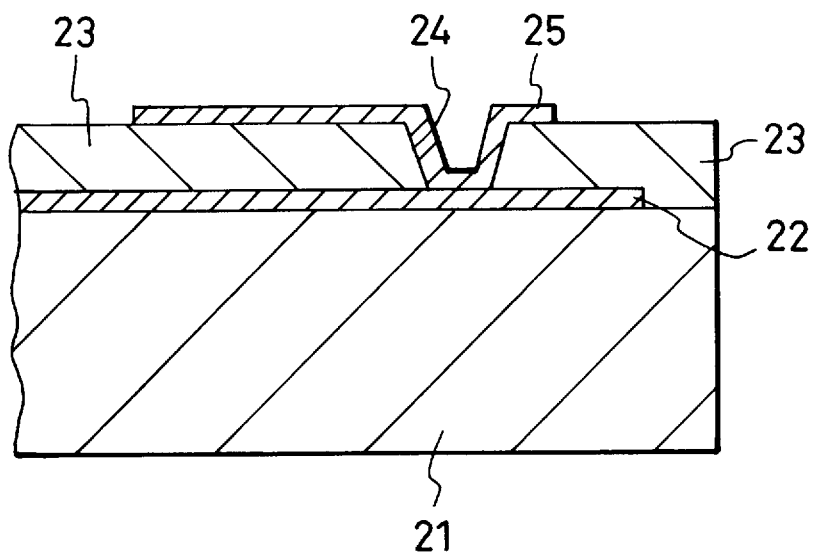
FIG. 1 is a partial, schematic cross-sectional view of a conventional multilayer wiring board.
Figure 2:
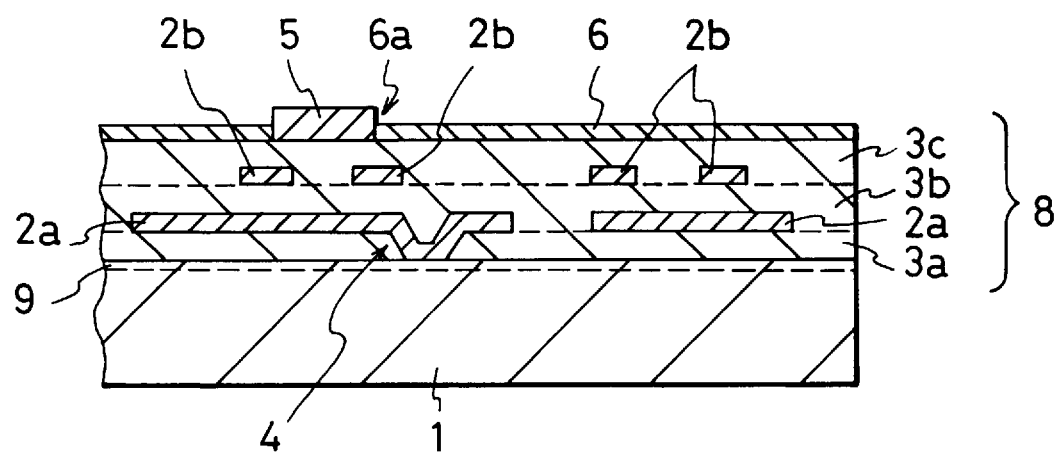
FIG. 2 is a partial, schematic cross-sectional view of a multilayer wiring board according to a first embodiment of the present invention.

In FIG. 2, a multilayer wiring structure according to the present invention is applied to a multilayer wiring board.

As shown in FIG. 2, the multilayer wiring board has a rigid base material 1 and a multilayer wiring structure 8 according to a first embodiment of the invention formed on the base material 1.

In this embodiment, the base material 1 is formed by a printed wiring board such as a copper clad laminate. The material 1 has a patterned conductive layer 9 on its upper side. However, it is needless to say that the base material 1 may be formed by any other type of wiring boards.

The multilayer wiring structure 8 includes a first-level interlayer insulating layer 3a, a first-level wiring layer 2a, a second-level interlayer insulating layer 3b, a second-level wiring layer 2b, a third-level interlayer insulating layer 3c, a bonding pad 5, and a protection layer 6.

The first-level interlayer insulating layer 3a is made of a benzocyclobutene resin and is formed on the surface of the base material 1. The layer 3a has a penetrating via hole 4.

The first-level wiring layer 2a is made of a patterned conductive layer and is formed on the first-level interlayer insulating layer 3a. The layer 2a is contacted with the underlying surface of the base material 1 through the via hole 4, thereby electrically connecting the layer 2a to the patterned conductive layer 9 of the base material 1.

The second-level interlayer insulating layer 3b is made of a benzocyclobutene resin and is formed to cover the first-level wiring layer 2a. The layer 3b is contacted with the exposed area of the first-level interlayer insulating layer 3a.

The second-level wiring layer 2b is made of a patterned conductive layer and is formed on the second-level interlayer insulating layer 3b.

The third-level interlayer insulating layer 3c is made of a benzocyclobutene resin and is formed to cover the second-level wiring layer 2b. The layer 3c is contacted with the exposed area of the second-level interlayer insulating layer 3b.

The protection layer 6 having a penetrating hole 6a is formed on the third-level interlayer insulating layer 3c, thereby covering the surface of the layer 3c. The protection layer 6 has flame-retardant or non-flammable property corresponding to the V-0 class in the UL 94 standard.

The bonding pad 5, which is used for mounting an electronic component or a semiconductor integrated circuit (IC) chip, is formed on the third-level interlayer insulating layer 3c through the hole 6a of the protection layer 6.

Each of the first- to third-level interlayer insulating layers 3a, 3b and 3c is formed by a coating process. The patterning process for the layers 3a, 3b and 3c is performed by popular photolithography and etching processes.

Each of the first- and second-level wiring layers 2a and 2b is formed by a popular metallization process such as plating and sputtering processes. The patterning process for the layers 2a and 2b is performed by popular photolithography and etching processes.

The protection layer 6 is formed by a coating process. The patterning process for the layer 6 is performed by popular photolithography and etching processes.

With the multilayer wiring board shown in FIG. 2, since the protection layer 6 having a flame-retardant or non-flammable property corresponding to the V-0 class in the UL 94 standard is formed to cover the third-level interlayer insulating layer 3c made of the benzocyclobutene resin, the flame-resistance performance is realized by the protection layer 6. As a result, no additional flame-retardant agent needs to be added to the benzocyclobutene resins forming the underlying third-, second- and first-level insulating layers 3c, 3b and 3a.

Accordingly, the multilayer wiring structure 8 (and consequently the multilayer wiring board itself) can obtain a flame-retardant property corresponding to the V-0 class in the UL 94 standard without degrading the inherent properties of the benzocyclobutene resins forming the insulating layers 3c, 3b and 3a.

The protection layer 6 is preferably made of a fluororesin or a polyimide resin, because this resin has a good heat-resistance property. However, an epoxy resin may be used if it can withstand against the heat applied during the subsequent soldering and mounting processes. Specifically, it is preferred that the resin forming the protection layer 6 has a glass transition temperature of 160° C or higher.

When the pad 5 is not finely patterned and an etching process with high accuracy is not necessary therefor, the protection layer 6 may be formed by a popular printing process. In this case, the protection layer 6 may be made of a solder-resist material used in a soldering process for mounting electronic components onto a printed wiring board. This leads to an additional advantage of a decreased fabrication cost.

Since the benzocyclobutene resin has a good adhesion to various materials, an inorganic layer with a non-flammable property such as silicon dioxide or silicon nitride may be used. In this case, for example, the inorganic layer is formed by a reduced-pressure chemical vapor deposition (CVD) process and then, the area of the protection layer 6 corresponding to the pad 5 is selectively etched away by popular photolithography and etching processes.

Second Embodiment

Figure 3:
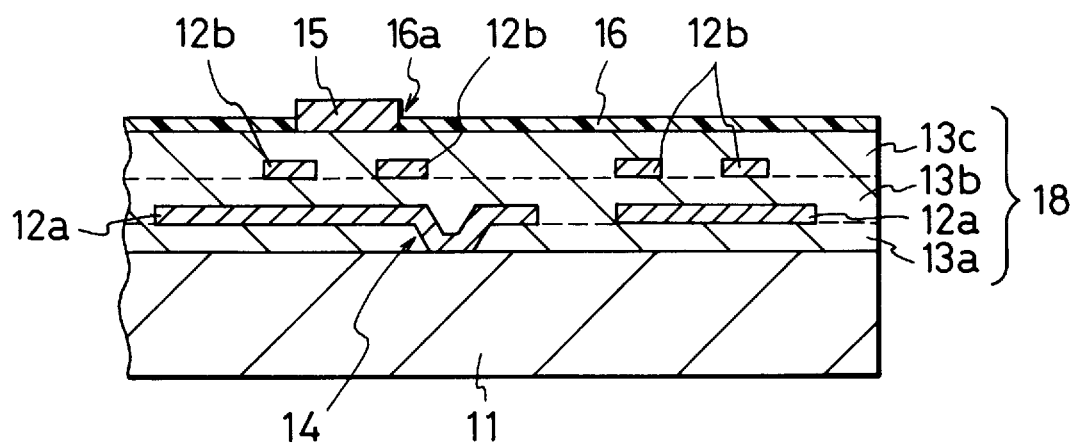
FIG. 3 is a partial, schematic cross-sectional view of a multilayer wiring board according to a second embodiment of the present invention.

FIG. 3 shows a multilayer-structured semiconductor device having a multilayer wiring structure according to a second embodiment of the invention.

As shown in FIG. 3, the multilayer-structured semiconductor device has a ceramic substrate 11 and a multilayer wiring structure 18 according to the second embodiment formed on the substrate 11. The ceramic forming the substrate 11 contains alumina as its primary constituent.

The multilayer wiring structure 18 has the same configuration as the multilayer wiring structure 8 of the first embodiment. Specifically, the structure 18 includes a first-level interlayer insulating layer 13a, a first-level wiring layer 12a, a second-level interlayer insulating layer 13b, a second-level wiring layer 12b, a third-level interlayer insulating layer 13c, a bonding pad 15, and a protection layer 16.

The first-level interlayer insulating layer 13a is made of a benzocyclobutene resin and is formed on the surface of the substrate 11. The layer 13a has a penetrating through hole 14.

The first-level wiring layer 12a is made of a patterned conductive layer and is formed on the first-level interlayer insulating layer 13a. The layer 12a is contacted with the underlying surface of the substrate 11 through the through hole 14, thereby electrically connecting the layer 12a to the substrate 11.

The second-level interlayer insulating layer 13b is made of a benzocyclobutene resin and is formed to cover the first-level wiring layer 12a. The layer 13b is contacted with the exposed area of the first-level interlayer insulating layer 13a.

The second-level wiring layer 12b is made of a patterned conductive layer and is formed on the second-level interlayer insulating layer 13b.

The third-level interlayer insulating layer 13c is made of a benzocyclobutene resin and is formed to cover the second-level wiring layer 12b. The layer 13c is contacted with the exposed area of the second-level interlayer insulating layer 13b.

The protection layer 16 having a penetrating hole 16a is formed on the third-level interlayer insulating layer 13c, thereby covering the surface of the layer 13c. The protection layer 16 has a flame-retardant or non-flammable property corresponding to the V-0 class in the UL 94 standard.

The bonding pad 15, which is used for mounting an electronic component or a semiconductor IC chip, is formed on the third-level interlayer insulating layer 13c through the hole 16a of the protection layer 16.

Each of the first- to third-level interlayer insulating layers 13a, 13b and 13c is formed by a coating process. The patterning process for the layers 13a, 13b and 13c is performed by popular photolithography and etching processes.

Each of the first- and second-level wiring layers 12a and 12b is formed by a popular metallization process such as plating and sputtering processes. The patterning process for the layers 12a and 12b is performed by popular photolithography and etching processes.

The protection layer 16 is formed by a coating process. The patterning process for the layer 16 is performed by popular photolithography and etching processes.

With the multilayer-structured semiconductor device shown in FIG. 3, since the protection layer 16 having a flame-retardant or non-flammable property corresponding to the V-0 class in the UL 94 standard is formed to cover the third-level interlayer insulating layer 13c made of the benzocyclobutene resin, the flame-resistance performance is realized by the protection layer 16. As a result, no additional flame-retardant agent needs to be added to the benzocyclobutene resins forming the underlying third-, second- and first-level insulating layers 13c, 13b and 13a.

Accordingly, the multilayer wiring structure 18 (and consequently the multilayer-structured semiconductor device itself) can obtain a flame-retardant property corresponding to the V-0 class in the UL 94 standard without degrading the inherent properties of the benzocyclobutene resins forming the insulating layers 13c, 13b and 13a.

Similar to the first embodiment, the protection layer 16 is preferably made of a fluororesin, a polyimide resin or an epoxy resin may be used. When the pad 15 is not finely patterned and an etching process with high accuracy is not necessary therefor, the protection layer 16 may be formed by a popular printing process. In this case, the protection layer 16 may be made of a solder-resist material. Further, an inorganic layer with a non-flammable property such as $SiO_2$ or $Si_3N_4$ may be used.

In the second embodiment, although the ceramic substrate 11 is used, a substrate made of a semiconductor material such as Si may be used.

To confirm the effects of the invention, the inventors carried out a flame-resistance test under the following conditions:

10 samples of a multilayer wiring board according to the first embodiment were prepared, in which a printed wiring board containing an epoxy resin was used as the base material 1. This printed wiring board corresponds to the FR-4 grade defined by the National Electrical Manufacturers Association (NEMA).

Further, each of the first- and second-level wiring layers 2a and 2b and the bonding pad 5 was formed by a patterned copper layer with a thickness of 4 μm. Each of the first- to third-level interlayer insulating layers 3a, 3b and 3c was formed by the same benzocyclobutene resin layer with a thickness of 10 μm.

As the protection layer 6, a fluororesin layer with a thickness of 5 μm was formed. This fluororesin is named "CYTOP" and produced by Asahi Glass Corporation.

On the other hand, 10 comparative examples of a conventional multilayer wiring board were prepared, which have the same configuration as that of the samples except that the protection layer 6 was not formed.

For the 10 samples and 10 comparative examples thus prepared, a flame resistance test for the multilayer wiring structure 8 was performed according to the UL 94 standard.

As a result, an average flaming time for the 10 comparative examples was 18 seconds. On the other hand, an average flaming time for the 10 samples was 2 seconds, which corresponds to the V-0 class in the UL 94 standard.

Additionally, the inventors carried out another flame-resistance test under the same conditions as above except that a $SiO_2$ layer with a thickness of 0.5 μm was formed as the non-flammable layer, instead of the fluororesin layer as the flame retardant layer.

As a result, an average flaming time for the additional 10 samples including the $SiO_2$ layer was 1.5 seconds, which corresponds to the V-0 class in the UL 94 standard also.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A multilayer wiring structure comprising:

a first lower-level interlayer insulating layer formed on a base material;

a lower-level wiring layer formed on said first lower-level interlayer insulting layer;

a second lower-level interlayer insulting layer formed to cover said lower-level wiring layer;

an upper-level wiring layer formed on said second lower-level interlayer insulating layer;

an upper-level interlayer insulating layer formed to cover said upper-level wiring layer; and a protection layer formed to cover said upper-layer interlayer insulating layer; wherein each of said first and second lower-level and said upper-level interlayer insulating layers is made of a benzocyclobutene resin; and said protection layer is made of a solder-resist material, and has a heat resistance property and a glass transition temperature of 160° C. or higher.

2. The multilayer wiring structure as claimed in claim 1, wherein said protection layer is made of a resin selected from the group consisting of a fluororesin, a polyimide resin, and an epoxy resin.

3. A multilayer wiring board having a base material, a first lower-level interlayer insulating layer formed on said base material, and a multilayer wiring structure formed on said first lower-level interlayer insulating layer; said multilayer wiring structure comprising:

a lower-level wiring layer formed on said first lower-level interlayer insulating layer;

a second lower-level interlayer insulating layer formed to cover said lower-level wiring layer;

an upper-level wiring layer formed on said second lower-level interlayer insulating layer;

an upper-level interlayer insulating layer formed to cover said upper-level wiring layer; and a protection layer formed to cover said upper-level interlayer insulating layer; wherein each of said first and second lower-level and said upper-level interlayer insulating layers is made of a benzocyclobutene resin; and said protection layer is made of a solder-resist material, and has a heat resistance property and a glass transition temperature of 160° C. or higher.

4. The multilayer wiring board as claimed in claim 3, wherein said protection layer is made of a resin selected from the group consisting of a fluororesin, a polyimide resin, and an epoxy resin.

5. A multilayer wiring structure comprising:

a lower-level wiring layer formed on an insulating base material;

a lower-level interlayer insulating layer formed to cover said lower-level wiring layer;

an upper-level wiring layer formed on said interlayer insulating layer;

an upper-level interlayer insulating layer formed to cover said upper-level wiring layer; and a protection layer formed to cover said upper-level interlayer insulating layer; wherein each of said lower- and upper-level interlayer insulating layers is made of a benzocyclobutene resin, and said protection layer is made of a solder-resist material, and has a heat resistance property and a glass transition temperature of 160° C. or higher.

6. The multilayer wiring structure as claimed in claim 5, wherein said insulating base material is a ceramic substrate containing alumina as its primary constituent.

* * * * *